(12) United States Patent
Orimoto et al.

(10) Patent No.: US 9,666,417 B2
(45) Date of Patent: May 30, 2017

(54) PLASMA PROCESSING APPARATUS AND METHOD FOR MONITORING PLASMA PROCESSING APPARATUS

(71) Applicant: Sakai Display Products Corporation, Sakai-shi, Osaka (JP)

(72) Inventors: Masahiko Orimoto, Sakai (JP); Atsushi Shoji, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 0 days.

(21) Appl. No.: 14/914,190

(22) PCT Filed: Aug. 12, 2014

(86) PCT No.: PCT/JP2014/071322
§ 371 (c)(1),
(2) Date: Feb. 24, 2016

(87) PCT Pub. No.: WO2015/029777
PCT Pub. Date: Mar. 5, 2015

(65) Prior Publication Data
US 2016/0211123 A1    Jul. 21, 2016

(30) Foreign Application Priority Data

Aug. 28, 2013 (JP) ................................. 2013-177104

(51) Int. Cl.
*G08B 21/00* (2006.01)
*H01J 37/32* (2006.01)
(Continued)

(52) U.S. Cl.
CPC ...... *H01J 37/32935* (2013.01); *C23C 16/505* (2013.01); *C23C 16/509* (2013.01);
(Continued)

(58) Field of Classification Search
CPC combination set(s) only.
See application file for complete search history.

(56) References Cited

U.S. PATENT DOCUMENTS

2003/0097984 A1    5/2003  Nakano et al.
2003/0178140 A1*   9/2003  Hanazaki .......... H01J 37/32935
                                                    156/345.28
(Continued)

FOREIGN PATENT DOCUMENTS

JP    2002-018274 A    1/2002
JP    2003-264100 A    9/2003
(Continued)

*Primary Examiner* — Travis Hunnings
(74) *Attorney, Agent, or Firm* — Bret E. Field; Bozicevic, Field & Francis LLP

(57) ABSTRACT

A plasma processing apparatus which generates plasma in a processing vessel supplied with a gas by applying a high-frequency voltage between first and second electrodes and performs plasma processing on a substrate to be processed, the plasma processing apparatus includes a recording unit configured to record a value, which represents a characteristic of the plasma processing performed on the substrate to be performed, in a time series, a identifying unit configured to identify a tendency of a time-series change of values recorded by the recording unit, a determination unit configured to determine whether an alarm is required based on the identified tendency of the time-series change and an alarm unit configured to output the alarm when it is determined that the alarm is required.

9 Claims, 5 Drawing Sheets

(51) Int. Cl.
C23C 16/509 (2006.01)
C23C 16/52 (2006.01)
C23C 16/505 (2006.01)
G01R 22/10 (2006.01)
G08B 21/18 (2006.01)

(52) U.S. Cl.
CPC .............. *C23C 16/52* (2013.01); *G01R 22/10* (2013.01); *G08B 21/182* (2013.01); *H01J 37/32082* (2013.01); *H01J 37/32091* (2013.01); *H01J 37/3299* (2013.01); *H01J 2237/332* (2013.01); *H01J 2237/334* (2013.01)

(56) References Cited

U.S. PATENT DOCUMENTS

2004/0254761 A1* 12/2004 Sakano ............ H01J 37/32935
702/182
2006/0235560 A1 10/2006 Ogawa et al.

FOREIGN PATENT DOCUMENTS

| JP | 2003-282542 A | 10/2003 |
|----|---------------|---------|
| JP | 2006-293433 A | 10/2006 |

* cited by examiner

PLASMA PROCESSING APPARATUS AND METHOD FOR MONITORING PLASMA PROCESSING APPARATUS

CROSS-REFERENCE TO RELATED APPLICATIONS

This application is the national phase of PCT International Application No. PCT/JP2014/071322 which has an International filing date of Aug. 12, 2014 and designated the United States of America.

FIELD

The present invention relates to a plasma processing apparatus for detecting abnormality of plasma processing and outputting an alarm, and a method for monitoring the plasma processing apparatus.

BACKGROUND

As a plasma processing apparatus for manufacturing a semiconductor device, a plasma chemical vapor deposition (CVD) apparatus which includes an introduction system and an exhaust system for gas provided in a reaction chamber, and generates plasma in the reaction chamber using a process gas and a high-frequency power, to form a thin film on a substrate by, and a dry etching apparatus which performs etching in a desired shape, and the like has been known in the art.

The plasma processing apparatus includes the reaction chamber for forming a film on the substrate and performing etching processing, a gas introduction unit for introducing a mixture of a plurality of gases including the process gas or the process gas alone into the reaction chamber, an exhaust unit for exhausting the process gas introduced into the reaction chamber, a pressure control valve for controlling exhaust velocity of the process gas to keep a predetermined pressure value in the reaction chamber, and the like, and controls an opening degree of the pressure control valve by a pressure controller depending on a detection signal of a vacuum gauge provided in the reaction chamber, thereby controlling the pressure in the reaction chamber. After controlling the pressure, in a semiconductor manufacturing apparatus in which a high-frequency power supply is provided, a high-frequency power is applied to an upper electrode and a lower electrode, such that plasma is generated in the reaction chamber, and processing is performed on the substrate which is mounted on the lower electrode using the generated plasma.

In the plasma processing apparatus, a product generated in the reaction chamber during the film forming processing and an etching product generated during the etching processing are deposited in the reaction chamber. The deposits not only generate particles in the reaction chamber, but also change a capacity of the reaction chamber. In addition, partial pressure of the process gas is changed due to outgas and the like from the deposits adhered inside the reaction chamber, such that processing characteristics of the process are also changed. Therefore, there is a need to regularly remove the product deposited in the reaction chamber depending on a processing amount or operation time.

SUMMARY

Conventionally, when the number of sheets of processed substrates on which the processing is performed or the processing time reaches a predetermined value, maintenance is performed.

However, as the current semiconductor processing, when the processing is performed on various types of semiconductors using the same semiconductor manufacturing apparatus, an amount of deposition of generated products is different for each type due to a difference in a thickness of a formed film and an etching amount, thus in a conventional management method, even when the processing characteristics are changed, the change may not be confirmed until a check in the next process. Further, even in the meantime, the semiconductor manufacturing apparatus continues to perform lot processing, such that a loss resulting therefrom is significantly large.

An object of the present invention is to provide a plasma processing apparatus and a method for monitoring the plasma processing apparatus, which are capable of detecting abnormality in a process of plasma processing and outputting an alarm.

A plasma processing apparatus according to the present application, includes a processing vessel, a gas supply unit configured to supply gas in the processing vessel, a first electrode which is disposed in the processing vessel and on which a substrate to be processed is mounted, and a second electrode which faces the first electrode, and generates plasma in the processing vessel supplied with the gas by applying a high-frequency voltage between the first and second electrodes to perform plasma processing on the substrate to be processed, the plasma processing apparatus is characterized by including a recording unit configured to record a value, which represents a characteristic of the plasma processing performed on the substrate to be performed, in a time series, a unit configured to identify a tendency of a time-series change of the value recorded by the recording unit, a determination unit configured to determine whether an alarm is required based on the identified tendency of the time-series change, and an alarm unit configured to output the alarm when it is determined that the alarm is required.

The plasma processing apparatus according to the present application is characterized in that the determination unit determines whether the tendency of the time-series change has a predetermined tendency, and when it is determined that the tendency of the time-series change has the predetermined tendency, so as to determine that the alarm is required.

The plasma processing apparatus according to the present application is characterized in that the determination unit includes a part configured to determine whether the values are continuously increased or decreased, a part configured to derive a maximum value and a minimum value of the values in a predetermined period including a period in which the values are continuously increased or decreased, and a part configured to determine whether a difference between the derived maximum value and the derived minimum value is greater than or equal to a threshold value, wherein the determination unit determines that the alarm is required when the difference between the maximum value and the minimum value is greater than or equal to the threshold value.

The plasma processing apparatus according to the present application is characterized in that the value representing the characteristic is a current value of current which are passed through the first or second electrode from the plasma generated in the processing vessel.

The plasma processing apparatus according to the present application is characterized in that the value representing the characteristic is a plasma impedance in the processing vessel.

A method for monitoring, by a computer, a plasma processing apparatus which performs plasma processing on a substrate to be processed by applying a high-frequency voltage between first and second electrodes disposed to face each other in a processing vessel and generating plasma by gas introduced into the processing vessel, the method for monitoring a plasma processing apparatus is characterized by including recording a value, which represents a characteristic of the plasma processing performed on the substrate to be processed, in a time series by the computer, identifying a tendency of a time-series change of the recorded values by the computer, determining whether an alarm is required based on the identified tendency of the time-series change by the computer, and outputting the alarm when it is determined that the alarm is required by the computer.

According to the present application, since abnormality in the processing vessel is monitored based on the tendency of change on a time series of the process parameter, the process may be stopped immediately at the time of detection of the abnormality, and the number of generated sheets of defective substrates may be kept at a minimum.

The above and further objects and features of the invention will more fully be apparent from the following detailed description with accompanying drawings.

DESCRIPTION OF EMBODIMENTS

Hereinafter, embodiments of the present invention will be described in detail with reference to the accompanying drawings illustrating embodiments thereof.

Figure 1:
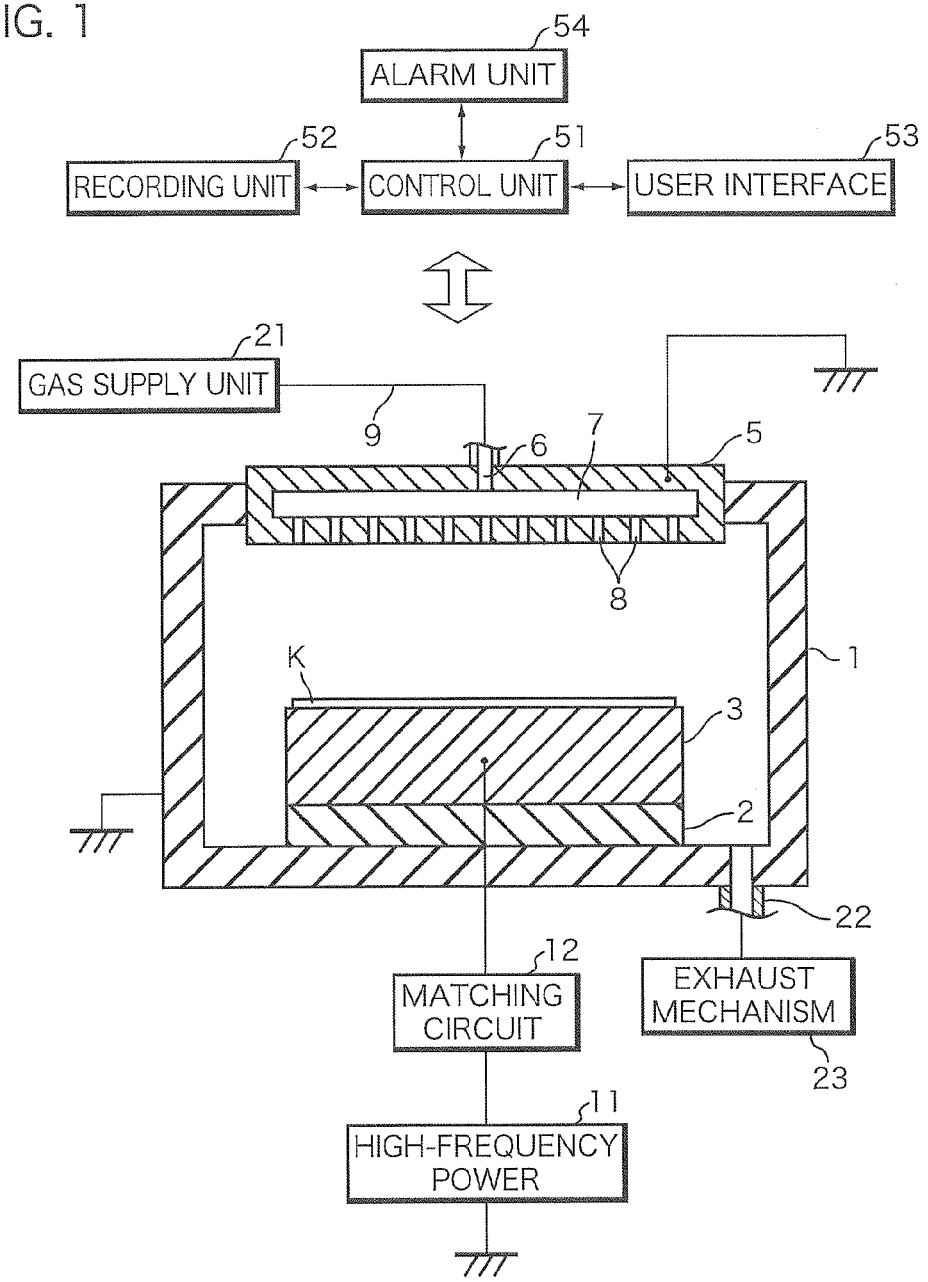
FIG. 1 is a schematic view illustrating a diagrammatic configuration of a plasma processing apparatus according to a present embodiment.

FIG. 1 is a schematic view illustrating a diagrammatic configuration of a plasma processing apparatus according to a present embodiment. The plasma processing apparatus according to the present embodiment is configured as, for example, a plasma chemical vapor deposition (CVD) apparatus which processes a substrate K which is a substrate to be processed by the plasma CVD.

The plasma processing apparatus is airtightly formed, and includes a chamber 1 into which the substrate K is carried. The chamber 1 is provided with a stage 3 serving as a lower electrode on a bottom portion thereof through a dielectric plate 2 made of ceramics, or the like. The stage 3 is made of metal such as aluminum, and the substrate K as the substrate to be processed is mounted thereon.

Further, the chamber 1 is provided with a shower head 5 on an upper portion thereof facing the stage 3, which serves as an upper electrode and is used to establish a ground. That is, the stage 3 serving as the lower electrode and the shower head 5 serving as the upper electrode form parallel plate electrodes. The shower head 5 includes a gas introduction port 6 in an upper portion thereof, a gas diffusion space 7 therein, and a plurality of gas exhaust holes 8 in a bottom portion thereof. The gas introduction port 6 is connected to a gas supply pipe 9, and a gas supply unit 21 supplying processing gas is connected to the other end of the gas supply pipe 9. In addition, the processing gas is supplied from the gas supply unit 21 into the chamber 1 through the gas supply pipe 9 and the shower head 5. As the processing gas, for example, fluoronitride gas is used.

An exhaust pipe 22 is connected to a bottom portion of the chamber 1, and the exhaust pipe 22 is connected to an exhaust mechanism 23 including a vacuum pump, a pressure adjustment valve, and the like. The exhaust mechanism 23 exhausts air from the chamber 1 to maintain inside the chamber 1 in a predetermined degree of vacuum.

The stage 3 serving as the lower electrode is connected to a high-frequency power supply 11 through a matching circuit 12. The high-frequency power supply 11 supplies, for example, high-frequency power having a frequency of 13.56 MHz to the stage 3. As a result, the stage 3 is configured so as to generate a predetermined bias voltage, thereby ions are drawn to the substrate K.

Each of components of the plasma processing apparatus is configured to be controlled by being connected to the control unit 51 including a microprocessor (computer) as illustrated in FIG. 1. The control unit 51 is connected to a recording unit 52 capable of storing a control program for implementing various processing performed by the plasma processing apparatus according to the control by the control unit 51, and a program (processing recipe) for performing processing on each of the components of the plasma processing apparatus depending on processing conditions. The recording unit 52 includes a recording medium such as a hard disk and a memory, and sequentially records various data such as control data and process parameter collected during an operation of the plasma processing apparatus, in association with the time.

Further, the processing recipe may be previously recorded in the recording unit 52, and may also be configured to be read into the recording unit 52 with being stored in a portable recording medium such as a CD-ROM or DVD. In addition, the recipe may also be appropriately transmitted from other devices, for example, through a private line. Further, as necessary, any processing recipe may be loaded from the recording unit 52 by an instruction of a worker or the like, to be performed by the control unit 51, such that a desired processing may be performed in the plasma processing apparatus under the control of the control unit 51.

In addition, the control unit 51 is connected with a user interface 53 including a keyboard for performing an input operation, etc. of a command for managing the plasma processing apparatus by the worker, and a display for displaying an operation situation of the plasma processing apparatus by visualizing it and the like.

One of the features of the present embodiment is that the control unit 51 specifies a tendency of a time-series change of the collected process parameter, determines that some type of abnormality occurs in the chamber 1 when the specified tendency of the time-series change has a predetermined tendency, and outputs an alarm through an alarm unit 54. For this purpose, the alarm unit 54 includes, for example, a unit outputting sound or light.

Further, in the present embodiment, the plasma processing apparatus includes the independent alarm unit 54, but it may also be configured to display a message indicating the fact that some type of abnormality occurs in the chamber 1 on a display or the like included in the user interface 53. In addition, it may also be configured to include a communication unit for transmitting a message indicating the fact that some type of abnormality occurs in the chamber 1 to a portable terminal device owned by the worker.

In a case of performing the plasma processing by using the above-described plasma processing apparatus, first, the substrate K as the substrate to be processed is carried into the chamber 1 through a carrying in-out port (not illustrated), and mounted on the stage 3. Further, the processing gas is introduced into the chamber 1 from the gas supply unit 21 through the shower head 5 while exhausting air in the chamber 1 by the exhaust mechanism 23. After controlling the pressure of the processing gas introduced into the chamber 1, the high-frequency power supply 11 applies a high-frequency power to the stage 3 serving as the lower electrode through the matching circuit 12 to generate plasma in the chamber 1, such that the plasma processing is performed on the substrate K which is mounted on the stage 3 using the generated plasma.

Figure 2:
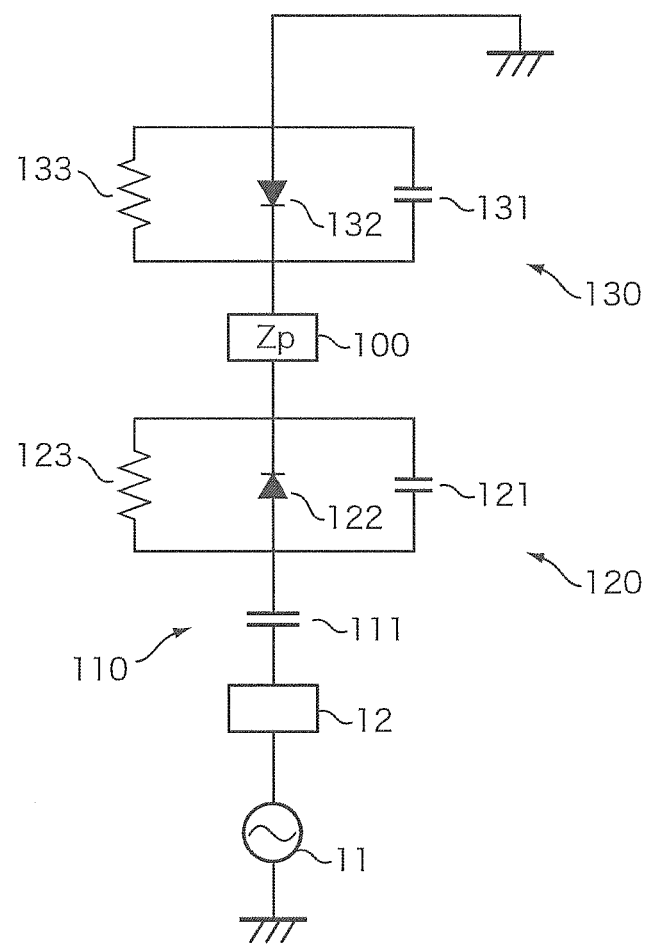
FIG. 2 is a circuit diagram illustrating an equivalent circuit of the plasma processing apparatus when performing plasma processing.

FIG. 2 is a circuit diagram illustrating an equivalent circuit of the plasma processing apparatus when performing the plasma processing. As illustrated in FIG. 2, the equivalent circuit includes a plasma 100 having plasma impedance Zp, a plasma sheath 120 on the lower electrode side, a plasma sheath 130 on the upper electrode side, a susceptor 110 connected to the plasma sheath 120 on the lower electrode side in series, the above-described high-frequency power supply 11 and matching circuit 12.

The plasma sheath 120 on the lower electrode side is illustrated as a circuit, in which a capacitor 121 indicating a capacity of the sheath portion, a diode 122 indicating that passage of current is limited in an interface, and a resistor 123 indicating a resistance to the ions at the sheath portion, are connected to each other in parallel. Further, the susceptor 110 is illustrated as a capacitor 111 formed in a manner that a susceptor body is interposed between the plasma and the lower electrode.

The plasma sheath 130 on the upper electrode side is the same as the plasma sheath 120 on the lower electrode side, thus is illustrated as a circuit, in which a capacitor 131 indicating a capacity of the sheath portion, a diode 132 indicating that the passage of current is limited in an interface, and a resistor 133 indicating a resistance to the ions at the sheath portion, are connected to each other in parallel.

In the configuration as described above, an ionic current passes through the resistor 123 of the plasma sheath 120, and a high-frequency component of the current passes through the susceptor 110 through the capacitor 111. In the present embodiment, the high-frequency component of the current passing through the susceptor 110 is collected, and an average value thereof is recorded in a time series in the recording unit 52 as one of the process parameters.

Figure 3:
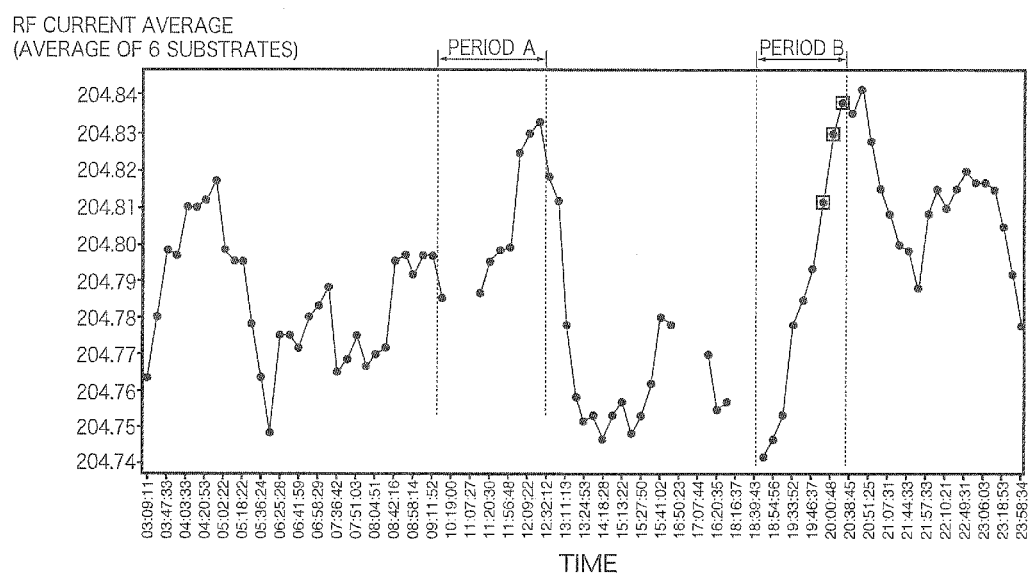
FIG. 3 is a graph illustrating a tendency of a time-series change of an RF current average value.

FIG. 3 is a graph illustrating a tendency of the time-series change of an RF current average value. The graph illustrated in FIG. 3 illustrates the tendency of the time-series change of the RF current average value by depicting the time in a horizontal axis and the RF current average value that is one of the process parameters in a vertical axis. Herein, as the RF current average value, an average value of six substrates K is used.

The RF current average value is momentarily changed depending on a change in a state of the plasma in the chamber 1, a change in a contained volume due to foreign matters in the chamber 1, and the like. Further, in accordance with a processing situation such as a case in which the number of substrates to be processed by the plasma processing apparatus is small, and a case in which maintenance of the plasma processing apparatus has been performed, a time interval between a previous process of the substrate to be processed and a current process of the substrate to be processed is longer than or equal to a predetermined time interval.

The alarm rule may be appropriately set based on the tendency of the time-series change of the above-described process parameter. In the present embodiment, the alarm rule is set so as to output the alarm when satisfying, for example, the following two conditions: (a) the RF current average value is continuously increased 6 times or more (however, when a time interval between an ending time of the previous process of the substrate to be processed and a staring time of the current process of the substrate to be processed is kept in 45 minutes or more, the RF current at the time of restarting the processing may show a waveform similar to that of the case in which abnormality is generated in the chamber 1, such that the first time of restarting the processing is not determined as an increase); and (b) a difference between a maximum value and a minimum value of the RF current average value among the latest 12 points is greater than or equal to 0.07. The above-described alarm rule is input by the worker using the user interface 53, and recorded in the recording unit 52.

Figure 4:
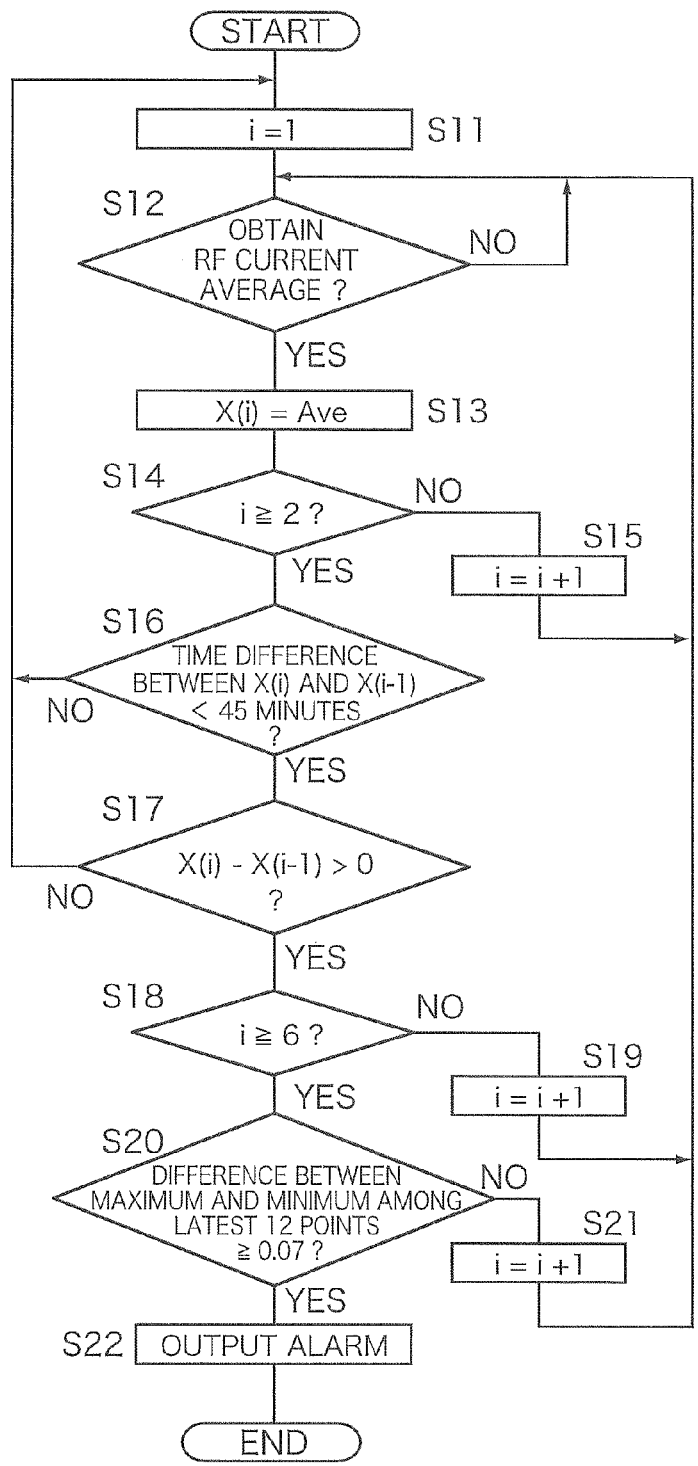
FIG. 4 is a flowchart illustrating a processing procedure of alarm determination processing performed by a control unit.

FIG. 4 is a flowchart illustrating a processing procedure of alarm determination processing performed by the control unit 51. The control unit 51 sequentially reads the process parameter (RF current average value) recorded in the recording unit 52, and determines whether the alarm is required to be output by performing the following processing procedure.

The control unit 51 sets a counter value i to be 1 (step S11). Next, the control unit 51 determines whether the RF current average value Ave newly recorded in the recording unit 52 is obtained (step S12), and when the RF current average value Ave is not obtained (NO in S12), waits until the RF current average value Ave is obtained.

When it is determined that the RF current average value Ave newly recorded in the recording unit 52 is obtained (YES in S12), the control unit 51 inputs the RF current average value Ave in a variable X (i) (step S13).

Next, the control unit 51 determines whether the counter value i is greater than or equal to 2 (step S14). When it is determined that the counter value i is greater than or equal to 2 (NO in S14), that is, when the counter value i is 1, the control unit 51 increments the counter value i by 1 (step S15), and then returns the processing to step S12.

When it is determined that the counter value i is greater than or equal to 2 (YES in S14), the control unit 51 determines whether a time difference in relation to a variable X (i−1) and the variable X (i) is less than 45 minutes (step S16). That is, in step S16, the control unit 51 determines whether a time difference between the process in which an i−1-th RF current average value Ave is obtained and the process in which an i-th RF current average value Ave is obtained is less than 45 minutes.

In step S16, when it is determined that the time difference in relation to the variable X (i−1) and the variable X (i) is greater than or equal to 45 minutes (NO in S16), the alarm rule defines that "when a time interval between the ending time of the previous process of the substrate to be processed and the staring time of the current process of the substrate to be processed is kept in 45 minutes or more, it is not determined as an increase." Therefore, the control unit 51 returns the processing to step S11 and performs the determination processing again from the beginning.

In step S16, when it is determined that the time difference in relation to the variable X (i−1) and the variable X (i) is less than 45 minutes (YES in S16), the control unit 51 determines whether a difference between the variable X (i) and X (i−1) is larger than 0 (step S17). That is, the control unit 51 determines whether the RF current average value Ave (=X(i)) obtained in the current process of the substrate to be processed is more increased than the RF current average value Ave (=X(i−1)) obtained in the previous process of the substrate to be processed.

In step S17, when the difference between the variable X (i) and the variable X (i−1) is smaller than or equal to 0 (NO in S17), it means that the RF current average value is decreased. Therefore, the above-described condition of the alarm rule that "the RF current average value is continuously increased 6 times or more" is not satisfied. Thereby, the control unit 51 returns the processing to step S11 and performs the determination processing again from the beginning.

In step S17, when it is determined that the difference between the variable X (i) and the variable X (i−1) is larger than 0 (YES in S17), the control unit 51 determines whether the counter value i is greater than or equal to 6 (step S18). When the counter value i is less than 6 (NO in S18), the control unit 51 increments the counter value i by 1 (step S19), and then returns the processing to step S12.

In step S18, when it is determined that the counter value i is greater than or equal to 6 (YES in S18), the control unit 51 determines whether a difference between a maximum value and a minimum value of the RF current average value among the latest 12 points is greater than or equal to 0.07 with reference to the RF current average value recorded in the recording unit 52 (step S20).

In step S20, when it is determined that the difference between the maximum value and the minimum value of the RF current average value among the latest 12 points is less than 0.07 (NO in S20), the alarm rule defines that "the difference between the maximum value and the minimum value of the RF current average value among the latest 12 points is greater than or equal to 0.07." Therefore, the control unit 51 increments the counter value i by 1 (step S21), and then returns the processing to step S12.

In step S20, when it is determined that the difference between the maximum value and the minimum value of the RF current average value among the latest 12 points is greater than or equal to 0.07 (YES in S20), the following two conditions of the alarm rule are satisfied: (a) the RF current average value is continuously increased 6 times or more, and (b) the difference between the maximum value and the minimum value of the RF current average value among the latest 12 points is greater than or equal to 0.07. Therefore, the control unit 51 outputs a control command for operating the alarm unit 54 to output the alarm (step S22).

Figure 5:
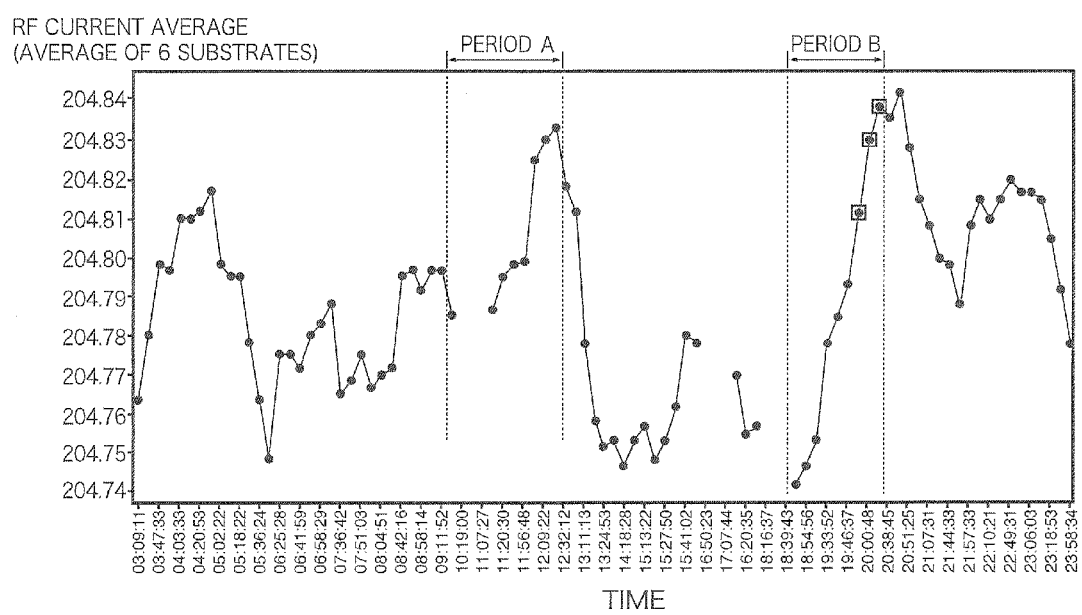
FIG. 5 is an explanatory view describing an example of applying an alarm rule.

FIG. 5 is an explanatory view describing an example of applying the alarm rule. The graph illustrated in FIG. 5 is the same as the graph illustrated in FIG. 3, and shows the tendency of the time-series change of the RF current average value by depicting the time in the horizontal axis and the RF current average value that is one of the process parameters in the vertical axis.

According to the graph illustrated in FIG. 5, the RF current average value is continuously increased 6 times or more in two periods of a period A and a period B. Among the two periods, in the period A, the condition that the difference between the maximum value and the minimum value of the RF current average value among the latest 12 points is greater than or equal to 0.07 is not satisfied, thus the alarm is not a target to be output. Further, the period A includes a period in which the time interval of 45 minutes or more is kept between the ending time of the previous process of the substrate to be processed and the staring time of the current process of the substrate to be processed, and the RF current average value is increased before and after the period, but it is not considered as an increase in the alarm determination processing according to the present embodiment.

Meanwhile, the period B has a process in which the conditions that the RF current average value is continuously increased 6 times or more and the difference between the maximum value and the minimum value of the RF current average value among the latest 12 points is greater than or equal to 0.07 are satisfied, thus the alarm is the target to be output. That is, 3 processes marked by a white square in the period B are the target of the alarm to be output.

As described above, in to the present embodiment, since the abnormality in the chamber 1 is monitored based on the tendency of the time-series change of the process parameter, the process may be stopped immediately at the time of detection of the abnormality, and the number of occurrence of defective substrates may be kept at a minimum.

Conventionally, after deposition processing and photo processing, a film unevenness inspection is performed. Therefore, when a time required from 3-layer deposition processing to the film unevenness inspection is set to be 10 hours, and the number of the substrates to be processed per unit time of the plasma processing apparatus is set to be 6, about 60 defective substrates may be generated even when the processing is stopped when the defective substrate is found out in the film unevenness inspection. Whereas, in the present application, since immediate response is possible, the number of occurrence of defective substrates may kept at about 1.

In addition, in the present embodiment, the alarm unit 54 is configured to output the alarm based on the process parameter collected by the plasma processing apparatus, but generally, a computer integrated manufacturing (CIM) system is connected to the upper stage of the plasma processing system, and the above-described control unit 51 serves to transfer instructions from the CIM system to the plasma processing system and transmit various data such as control data of the plasma processing apparatus and the process parameter to the CIM system. Thus, in the CIM system, a computer connected to the CIM system, or the like, it may be configured to determine whether the alarm is required, and when it is determined that the alarm is required, output the alarm.

Further, in the present embodiment, the alarm rule is configured to set with respect to the RF current average value which is one of the process parameters, but the process parameter for setting the alarm rule is not limited to the RF current average value, and other process parameters such as a plasma impedance may also be used. In this case, whether the alarm is required to be output may also be determined based on whether the process parameter is continuously decreased, rather than based on whether the process parameter is continuously increased.

Furthermore, in the present embodiment, the alarm rule is configured to set with respect to one process parameter, but the alarm rule may also be set by combining a plurality of process parameters.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims. In addition, technical features described in each embodiment may be combined with each other, and new technical features may be formed by the combination.

It is noted that, as used herein and in the appended claims, the singular forms "a", "an", and "the" include plural referents unless the context clearly dictates otherwise.

The invention claimed is:

1. A plasma processing apparatus which generates plasma in a processing vessel supplied with a gas by applying a high-frequency voltage between first and second electrodes and performs plasma processing on a substrate to be processed, the plasma processing apparatus comprising:
    a recording medium on which values are recorded in a time series, the values represent a characteristic of the plasma processing performed on the substrate to be performed;
    a controller which identifies a tendency of a time-series change of the values recorded on the recording medium, and determines whether an alarm is required based on the identified tendency of the time-series change; and
    an alarm device indicating a fact that some type of abnormality occurs in the processing vessel when it is determined that the alarm is required,
    wherein the controller determines whether the values are continuously increased or decreased, derives a maximum value and a minimum value of the values in a predetermined period including a period in which the values are continuously increased or decreased, and determines whether a difference between the maximum value and the minimum value is greater than or equal to a threshold value, and
    wherein the controller determines that the alarm is required when the difference between the maximum value and the minimum value is greater than or equal to the threshold value.

2. The plasma processing apparatus according to claim 1, wherein the controller determines whether the tendency of the time-series change has a predetermined tendency, and when it is determined that the tendency of the time-series change has the predetermined tendency, so as to determine that the alarm is required.

3. The plasma processing apparatus according to claim 1, wherein the values representing the characteristic are current values of current which are passed through the first or second electrode from the plasma generated in the processing vessel.

4. The plasma processing apparatus according to claim 1, wherein the values representing the characteristic are plasma impedances in the processing vessel.

5. The plasma processing apparatus according to claim 1, wherein the recording medium is a hard disk or a memory.

6. The plasma processing apparatus according to claim 1, wherein the controller is a computer or a microprocessor.

7. The plasma processing apparatus according to claim 1, wherein the alarm device is a device outputting sound or light indicating the fact.

8. The plasma processing apparatus according to claim 1, wherein the alarm device is a device for transmitting a message indicating the fact.

9. A method for monitoring, by a computer, a plasma processing apparatus which performs plasma processing on a substrate to be processed by applying a high-frequency voltage between first and second electrodes disposed to face each other in a processing vessel and generating plasma by gas introduced into the processing vessel, the method for monitoring a plasma processing apparatus comprising:
    recording a value, which represents a characteristic of the plasma processing performed on the substrate to be processed, in a time series by the computer;
    identifying a tendency of a time-series change of the recorded values by the computer;
    determining whether the values are continuously increased or decreased by the computer,
    deriving a maximum value and a minimum value of the values in a predetermined period including a period in which the values are continuously increased or decreased by the computer,
    determining whether a difference between the maximum value and the minimum value is greater than or equal to a threshold value by the computer, and
    outputting an alarm when it is determined that the difference between the maximum value and the minimum value is greater than or equal to the threshold value by the computer.

* * * * *